United States Patent [19]
Yamada et al.

[11] Patent Number: 5,545,443
[45] Date of Patent: Aug. 13, 1996

[54] METHOD FOR PRODUCING A TRANSPARENT CONDUCTIVE ZNO FILM BY INCORPORATING A BORON OR ALUMINUM CONTAINING MATERIAL

[75] Inventors: Akira Yamada, Tokyo; Shinichiro Yoshida; Masahiro Yoshino, both of Kurobe; Kiyoshi Takahashi, Tokyo; Akira Omura, Kurobe; Makoto Konagai, 6-18-1-437, Minamioi, Shinagawa-ku, Tokyo, all of Japan

[73] Assignees: Yoshida Kogyo K.K.; Makoto Konagai, both of Tokyo, Japan

[21] Appl. No.: 416,486

[22] Filed: Apr. 4, 1995

Related U.S. Application Data

[63] Continuation of Ser. No. 53,819, Apr. 29, 1993, abandoned, which is a continuation of Ser. No. 850,951, Mar. 11, 1992, abandoned.

[30] Foreign Application Priority Data

Mar. 11, 1991 [JP] Japan .................................. 3-069455

[51] Int. Cl.⁶ .................................................. C23C 16/48
[52] U.S. Cl. .................. 427/584; 427/126.3; 427/255.3; 427/294; 427/314; 427/558
[58] Field of Search ............................ 427/126.3, 255.3, 427/582, 584, 558, 314, 294

[56] References Cited

U.S. PATENT DOCUMENTS

| | | | |
|---|---|---|---|
| 3,907,616 | 9/1975 | Wiemer | 148/188 |
| 4,631,199 | 12/1986 | Hall et al. | 427/582 |
| 4,751,149 | 6/1988 | Vijayakumar et al. | 428/702 |
| 4,753,818 | 6/1988 | Rogers, Jr. | 427/54.1 |
| 4,798,808 | 1/1989 | Berman | 437/4 |
| 4,873,118 | 10/1989 | Elias et al. | 427/39 |
| 4,888,203 | 12/1989 | Rothschild et al. | 427/586 |

FOREIGN PATENT DOCUMENTS 62-154411  7/1987  Japan .

OTHER PUBLICATIONS

Morosanu, C. E., Thin Films by Chemical Vapour Deposition; Elsevier, 1990, pp. 51–52 (No month included).

*Primary Examiner*—Bernard Pianalto
*Attorney, Agent, or Firm*—Hill, Steadman & Simpson

[57] ABSTRACT

The formation of a transparent conductive ZnO film on a substrate in accordance with the chemical vapor deposition process is accomplished herein by a method characterized by feeding purified water and an organic metal material for Zn as separately entrained by a carrier gas into a vacuum chamber having a reduced inner pressure, adjusting the gas pressure inside the vacuum chamber to a level in the range of from 1 to 30 Torrs, supplying diborane gas or a compound containing boron or aluminum into the vacuum chamber, heating a substrate disposed inside the chamber to a prescribed temperature, and performing the ensuant formation of a film under the adjusted gas pressure mentioned above. Preferably, the formation of the film on the substrate disposed inside the vacuum chamber is carried out while the substrate is kept irradiated with ultraviolet light. This method enables the transparent conductive ZnO film possessing a textured surface form, exhibiting low resistivity, and particularly befitting adoption as a transparent conductive film in a thin-film solar cell to be produced at a relatively high film-forming rate.

4 Claims, 3 Drawing Sheets

METHOD FOR PRODUCING A TRANSPARENT CONDUCTIVE ZNO FILM BY INCORPORATING A BORON OR ALUMINUM CONTAINING MATERIAL

This is a continuation of application Ser. No. 08/053,819, filed Apr. 29, 1993 and now abandoned, which was a continuation of application Ser. No. 07/850,951, filed Mar. 11, 1992 and now abandoned.

BACKGROUND OF THE INVENTION

1. Field of the Invention

This invention relates to a method for the production of a transparent conductive ZnO film and more particularly to a method for the production of a transparent conductive ZnO film which can be formed at a relatively low temperature and whose surface form can be controlled as desired by selecting the film-forming conditions.

2. Description of the Prior Art

As the transparent conductive film which finds utility as in touch switches, liquid crystal display elements, and EL (electroluminescent) devices, an indium oxide-tin oxide type transparent conductive film known popularly as an "ITO film" has been generally adopted to date. Since the indium, one of the raw materials for this ITO film, is a rare metal, the ITO film is expensive by reason of acquisition as a resource. Further, since the ITO film requires a treatment at elevated temperatures in the range of from 250° C. to 600° C., it entails the disadvantage that the production consumes a large amount of energy and proves to be expensive.

As the transparent conductive film used in the thin-film solar cell, $SnO_2$ has been finding popular acceptance to date. However, the $SnO_2$ film has a problem of unduly large energy consumption because the film-forming temperature of this compound is so high as to fall typically in the neighborhood of 500° C. Further, the thin film of $SnO_2$ has the disadvantage that it finds only conspicuously limited utility in view of the heat resistance of the substrate. When a thin film of $SnO_2$ is to be formed on the surface of a glass substrate, for example, a film of $SiO_2$ is preparatorily formed as an undercoat on the surface and then the film of $SnO_2$ is superposed on the undercoat. Thus, the superposition of the thin film of $SnO_2$ turns out to be complicate in point of treatment.

Recently, the fitness of ZnO as a transparent electrode and an unreflective film for solar cells of amorphous silicon and $CuInSe_2$ has come to find popular recognition. As measures to effect production of a transparent conductive ZnO film, the spattering method, the ion plating method, and the vacuum deposition method have been generally known in the art. It has been also known that the film can be produced by the chemical vapor deposition process or other film-forming technique, as disclosed in the Japanese Patent Application laid open to public inspection (KOKAI) No. 154,411/1987.

Since the conventional film-forming techniques mentioned above except for the spattering method require elevated temperatures in the formation of a film, in the manufacture of a device, the possibility of the performance of the produced device being impaired by the elevated temperature used during the formation of a film and the problem of the film formation at an elevated temperature mentioned above must be taken into due consideration. On the other hand, when the spattering method is adopted for the formation of the film, the control of the form of the film surface is not attained, depending on certain conditions of the operation. Specifically, the spattering method does not easily confer a textured form (rugosity or unevenness) upon a film surface. When the thin film of ZnO on the surface of a sensitive part as in a solar cell, for example, has a textured form, the textured form can be expected to produce an effect of scattering light and, in consequence of the resultant addition to the length of a light path, to enhance the performance of the device. In the circumstances, the desirability of developing a method for forming a thin film of ZnO possessed of a textured surface form has been finding growing recognition.

SUMMARY OF THE INVENTION

An object of this invention, therefore, is to provide a method for the production of a transparent conductive ZnO film which can be formed at a lower temperature and can have the form of the film surface controlled as desired by the selection of film-forming conditions.

A further object of this invention is to provide a method capable of producing at a relatively high film-forming rate or deposition rate a transparent conductive ZnO film possessed of a textured surface form and endowed with lower resistivity.

To accomplish these objects, this invention provides a method for the production of a transparent conductive ZnO film on a substrate by the chemical vapor deposition process, which method is characterized by feeding purified water and an organic metal material for Zn as entrained by their respective carrier gases into a vacuum chamber having a reduced inner pressure, adjusting the gas pressure therein to a level in the range of from 1 to 30 Torrs, feeding into the chamber either diborane gas or a compound containing boron or aluminum, and heating a substrate disposed inside the chamber to a prescribed temperature thereby effecting formation of said film on the substrate under the gas pressure mentioned above.

In a preferred embodiment of this invention, the substrate disposed in the chamber is kept irradiated with ultraviolet light while the formation of the film is in progress.

More specifically, this invention provides a method for the production of a transparent conductive ZnO film, which comprises the preparatory steps of establishing an empty space of reduced pressure inside a vacuum chamber, heating a substrate disposed inside the chamber to a temperature of not higher than 300° C., feeding purified water as entrained by an inert carrier gas into the chamber, and adjusting the gas pressure inside the chamber to a level in the range of from 1 to 30 Torrs and the film-forming steps of supplying an organic metal material for Zn as entrained by a carrier gas in conjunction with an organic compound containing boron or aluminum into said chamber, and continuing the ensuing formation of said film under the adjusted gas pressure mentioned above.

DETAILED DESCRIPTION OF PREFERRED EMBODIMENTS

Figure 1:
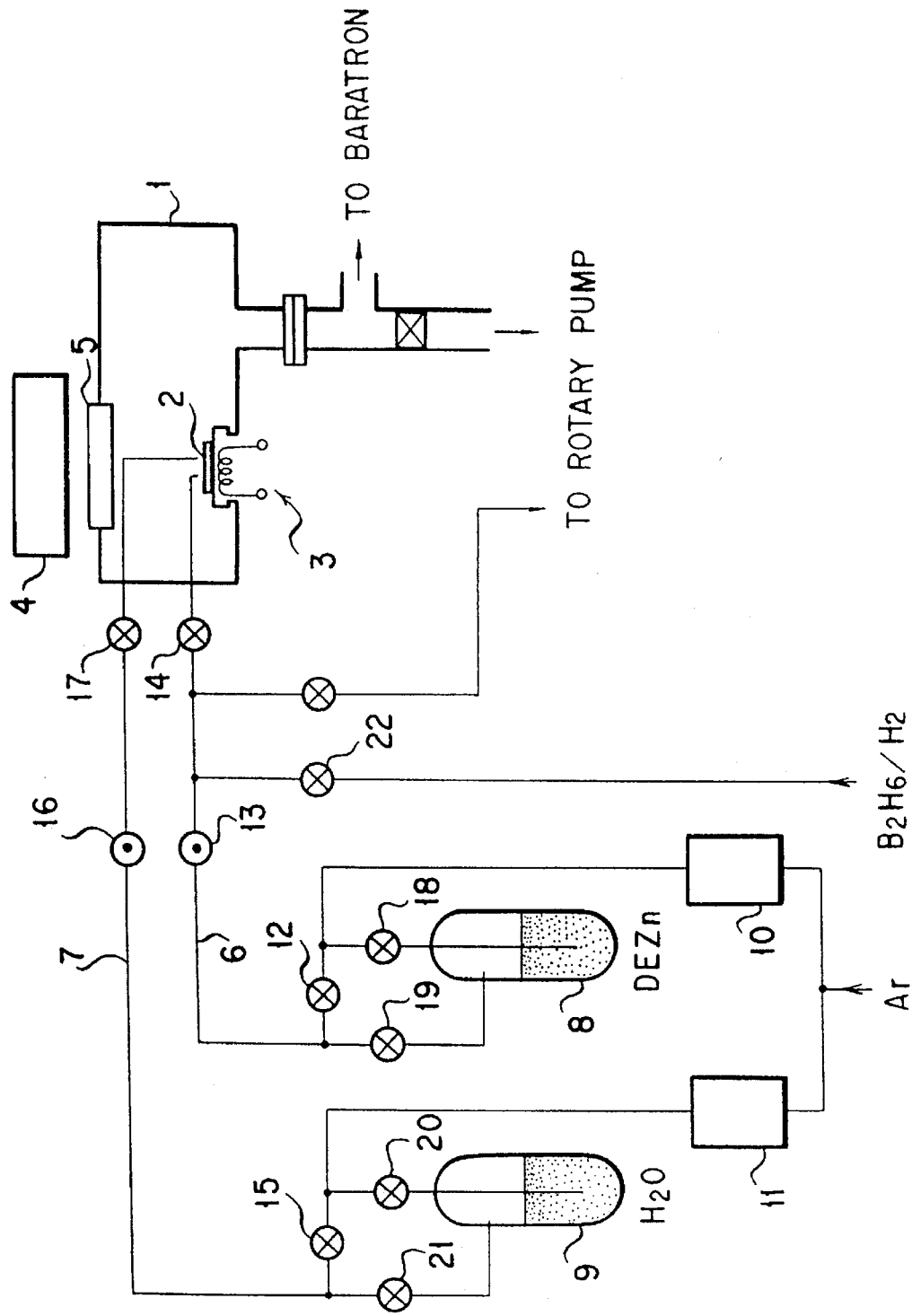
FIG. 1 is a schematic diagram of a MOCVD device used in a working example of this invention.

By the inventors' study, it has been found that in the production of a transparent conductive ZnO film on a substrate by the chemical vapor deposition process, a transparent conductive ZnO film possessed of a textured surface form (rugosity and unevenness) and endowed with lower resistivity can be formed at a lower temperature of the level of about 150° C. by using an organic metal compound of Zn, which is also referred to as an organozinc compound, and purified water as reactant gases, using a compound containing boron or aluminum as a dopant, and effecting a deposition of a zinc oxide film on the substrate under a reduced pressure in the range of from 1 to 30 Torrs.

To be specific, a transparent conductive ZnO film of a textured structure is obtained at a lower temperature approximating 150° C. by creating an empty space of reduced pressure inside a vacuum chamber, heating a substrate disposed inside the chamber to a prescribed temperature (preferably below 300° C.), feeding into the chamber purified water and an organic metal material for Zn as separately entrained by an inert carrier gas such as of At, adjusting the gas pressure in the chamber to a level in the range of from 1 to 30 Torrs, feeding into the chamber either diborane gas or a compound containing boron or aluminum, and consequently enabling the organozinc compound to form a film with the gas pressure adjusted accordingly (MOCVD process).

In this case, the surface form of the thin film of ZnO hinges heavily on the temperature of growth. By observation of scanning electron microphotographs of thin films of ZnO deposited at varying substrate temperatures, it is noted that the film obtained at a growth temperature of 150° C. assumed a surface form consisting of projections resembling tetrapots or bent branches having a representative size of about 0.5 μm, the film obtained at a growth temperature approximating 210° C. assumed a surface form consisting of projections larger in thickness and length, and the film obtained at a higher growth temperature approximating 270° C. and the film obtained at a lower growth temperature approximating 120° C. assumed a jogging surface form consisting of fractured projections resembling tetrapots or bent branches or short fibers or dots smaller in size. These results agree satisfactorily with the results of the determination of X-ray diffraction. The surface form of the produced thin film of ZnO, therefore, can be controlled mainly by adjusting the substrate temperature. The produced thin film of ZnO is possessed of good transparency with a wavelength falling in a wide range of from 400 to 1,400 nm or more.

By the inventors' study, it has been further found that the irradiation of the substrate with UV light during the growth of the thin film of ZnO is highly effective in improving the mobility of electrons. To be more specific, when the substrate disposed inside the vacuum chamber is kept irradiated with ultraviolet light while the formation of the film by the aforementioned MOCVD process is in progress (light-MOCVD process), the produced transparent conductive ZnO film enjoys heightened mobility of electrons, proportionately lowered resistivity, and more improved characteristic properties. A ZnO film produced by this light-MOCVD process in a film thickness of 2.4 μm, for example, exhibited low sheet resistivity of about 2.7 Ω/□. An amorphous silicon solar cell produced with this ZnO film exhibited good conversion efficiency. The ultraviolet light to be used in this light-MOCVD process is desired to have a wavelength of not more than 254 nm and to be consumed at a rate of not less than 1 mW/cm$^2$ on the substrate. The light sources which are usable effectively for the ultraviolet light include low-pressure mercury vapor lamp, high-pressure mercury vapor lamp, xenon lamp, metal halide lamp, and deuterium discharge lamp, for example. Otherwise, the excimer laser beam may be used as the source for the ultraviolet light.

For the MOCVD process and the light-MOCVD process contemplated by this invention as described above, the pressure inside the vacuum chamber is desired to be in the range of from 1 to 30 Torrs. If this pressure is less than 1 Torr, the disadvantage arises that the rate of film formation is low, the electrical properties of the produced thin film of ZnO are inferior, and the produced film acquires a textured surface form only with difficulty. Conversely, if the pressure exceeds 30 Torrs, the disadvantage ensues that the produced film assumes a powdery form and exhibits inferior electrical properties.

The organozinc compound which are usable commercially advantagously in the aforementioned MOCVD process and light-MOCVD process of this invention, include dimethyl zinc [Zn (CH$_3$)] and diethyl zinc [Zn(CH$_2$H$_5$)$_2$], for example.

The materials which are effectively usable for the incorporation of a doping element (B, Al) in the thin film of ZnO for the purpose of enhancing the electroconductivity of the film include trimethyl boron, triethyl boron, and diborane for B and triethyl aluminum, thriisobutyl aluminum, and dimethyl aluminum hydride for Al, for example. All of these organic compounds are possessed of reactivity to be manifested in response to the action of ultraviolet light.

Now, this invention will be described more specifically below with reference to working examples. As a matter of course, this invention is not limited to the following examples. It ought to be easily understood by any person of ordinary skill in the art that this invention allows various modifications within the scope of the spirit of this invention.
Apparatus to be used:

A MOCVD apparatus used in this working example is illustrated schematically in FIG. 1. Diethyl zinc (hereinafter referred to briefly as "DEZn")and purified water to be used for the reaction are separately supplied from bubblers 8 and 9 as entrained by an Ar carrier gas passed preparatorily through a purifying device (omitted from illustration) with the aid of tubes 6 and 7, which are made of stainless steel and extend into a vacuum chamber 1 in a perpendicular direction to a substrate 2 disposed horizontally inside the vacuum chamber 1. The B$_2$H$_6$ gas (prepared in a concentration of 1% and diluted with hydrogen), which is intended for boron doping, is supplied via the same tube 6 which is used for the DEZn. The vacuum chamber 1 is provided in the part of the shell thereof directly above the substrate 2 with a window 5 made of synthetic quartz. The ultraviolet light from an ultraviolet lamp 4 (low-pressure mercury vapor lamp) is passed through this window and made to impinge on the substrate 2. The substrate 2 is set in place above a heater 3. A heater (not shown) for heating the gases being supplied for the treatment was coiled round the stainless steel tubes 6 and 7 laid from the bubblers 8 and 9 to the vacuum chamber 1 and round the chamber 1. Denoted by 10 and 11 are mass flow controllers.
Substrate:

For the substrate, a piece of Corning Glass 7059 measuring 4×4 cm was used. This substrate was washed with ultrasonic waves as it was immersed sequentially in separate solutions of trichloroethylene, acetone, methanol, and purified water in the order mentioned for a period of 10 minutes per solution in advance of the formation of a film thereon.

Procedure:

The operation for the formation of a film was carried out by the following procedure. First, the substrate 2 was set in place on the heater 3 installed inside the vacuum chamber 1. The interior of the vacuum chamber 1 was evacuated of the entrapped air to a degree of vacuum by the use of a rotary pump (not shown). After the temperature of the substrate 2 and the temperature of the bubblers 8 and 9 were elevated to their respectively prescribed levels, the flow of the carrier gas into the vacuum chamber 1 was started by opening valves 12, 14, 15 and 17 and needle valves 13 and 16. Then, valves 18 and 20 were opened and thereafter the needle valves 13 and 16 were adjusted to give an inner pressure of 1 atmospheric pressure (which may be selected arbitrarily) to the bubblers 8 and 9. Subsequently, argon gas containing $H_2O$ in a prescribed concentration was introduced into the vacuum chamber 1 by closing the valve 15 and opening a valve 21. After the internal pressure of the chamber reached a prescribed level, the substrate 2 was irradiated with ultraviolet light from the ultraviolet lamp 4 and the introduction of DEZn and $B_2H_6$ into the vacuum chamber 1 was started by closing the valve 12 and opening the valves 19 and 22, with the result that the formation of the film was initiated.

Conditions of operatrion:

The production of a thin film of ZnO was performed under the following conditions.

Inner pressure of the DEZn bubbler 8: 760 Torrs (1 atm)

Inner temperature of the DEZn bubbler: 27°0 C. (fixed)

Inner pressure of the $H_2O$ bubbler 9: 760 Torrs (1 atm)

Inner temperature of the $H_2O$ bubbler: 37° C. (fixed)

Flow rate of carrier gas: 10 sccm

Time for growth: 60 minutes

Temperature of substrate: 150° C.

Inner pressure of vacuum chamber: 6 Torrs

Flow rate of DEZn: 10.4 μmols/min.

Flow rate of $H_2O$: 26.8 μmols/min.

Flow rate of $B_2H_6$: 0 to 0.7 μmol/min.

UV lamp (low-pressure mercury vapor lamp): 184.9 nm, 253.7 nm

Figure 2:
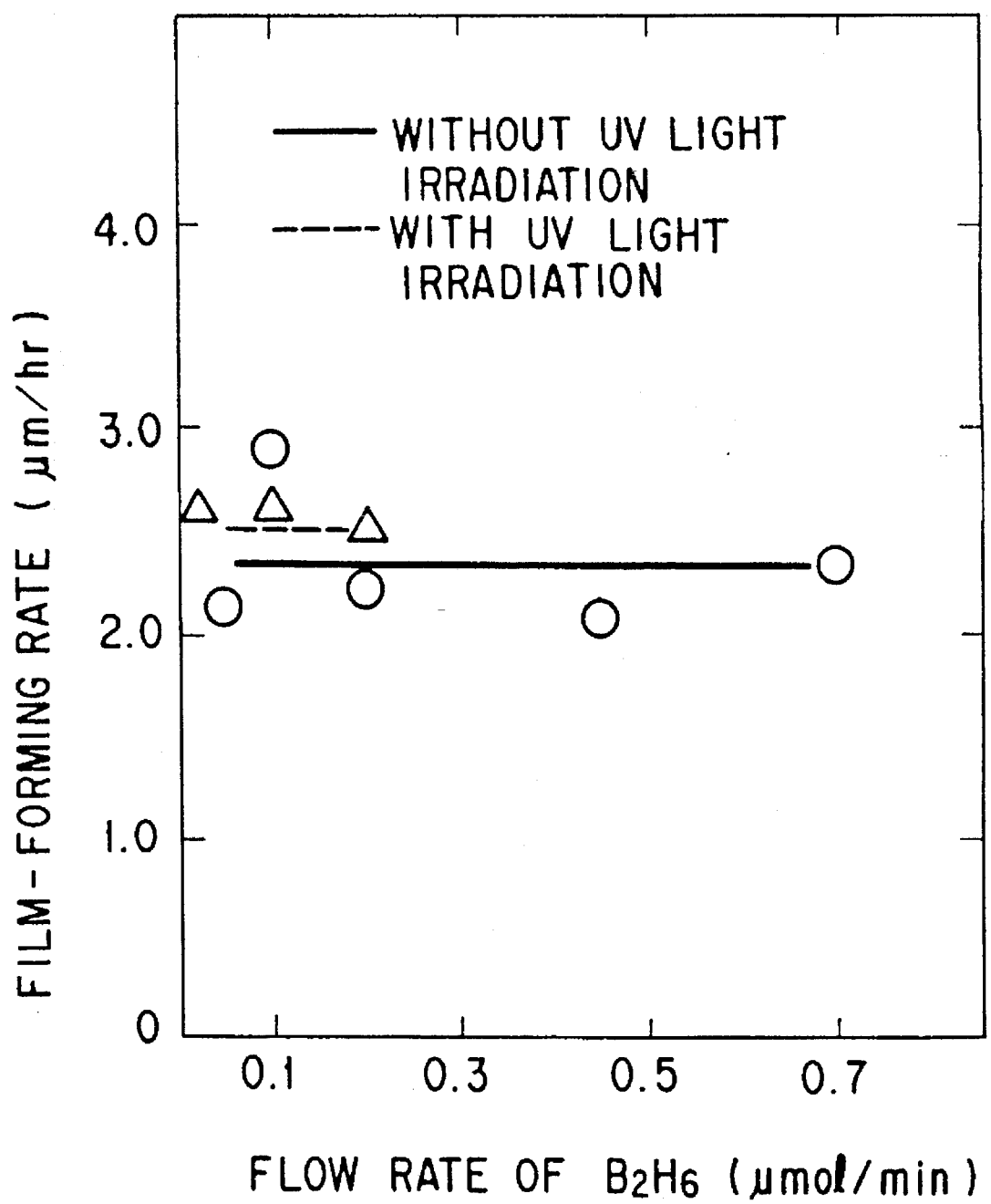
FIG. 2 is a graph showing the relation between the flow rate of $B_2H_6$ and the rate of film formation obtained in the presence and absence of the irradiation with ultraviolet light.

The relation between the flow rate of $B_2H_6$ and the rate of film formation obtained in the working example described above in the presence and absence of the irradiation of the ultraviolet light is shown in FIG. 2. It is clearly noted from FIG. 2 that the film-forming rate of the thin film of ZnO was substantially fixed without reference to the flow rate of $B_2H_6$ in the absence of the irradiation of the ultraviolet light. This trend was similarly observed in the presence of the irradiation of the ultraviolet light. A sizable addition to the rate of the formation of film was observed when the irradiation of the ultraviolet light was used as compared with the operation omitting the use thereof.

Figure 3:
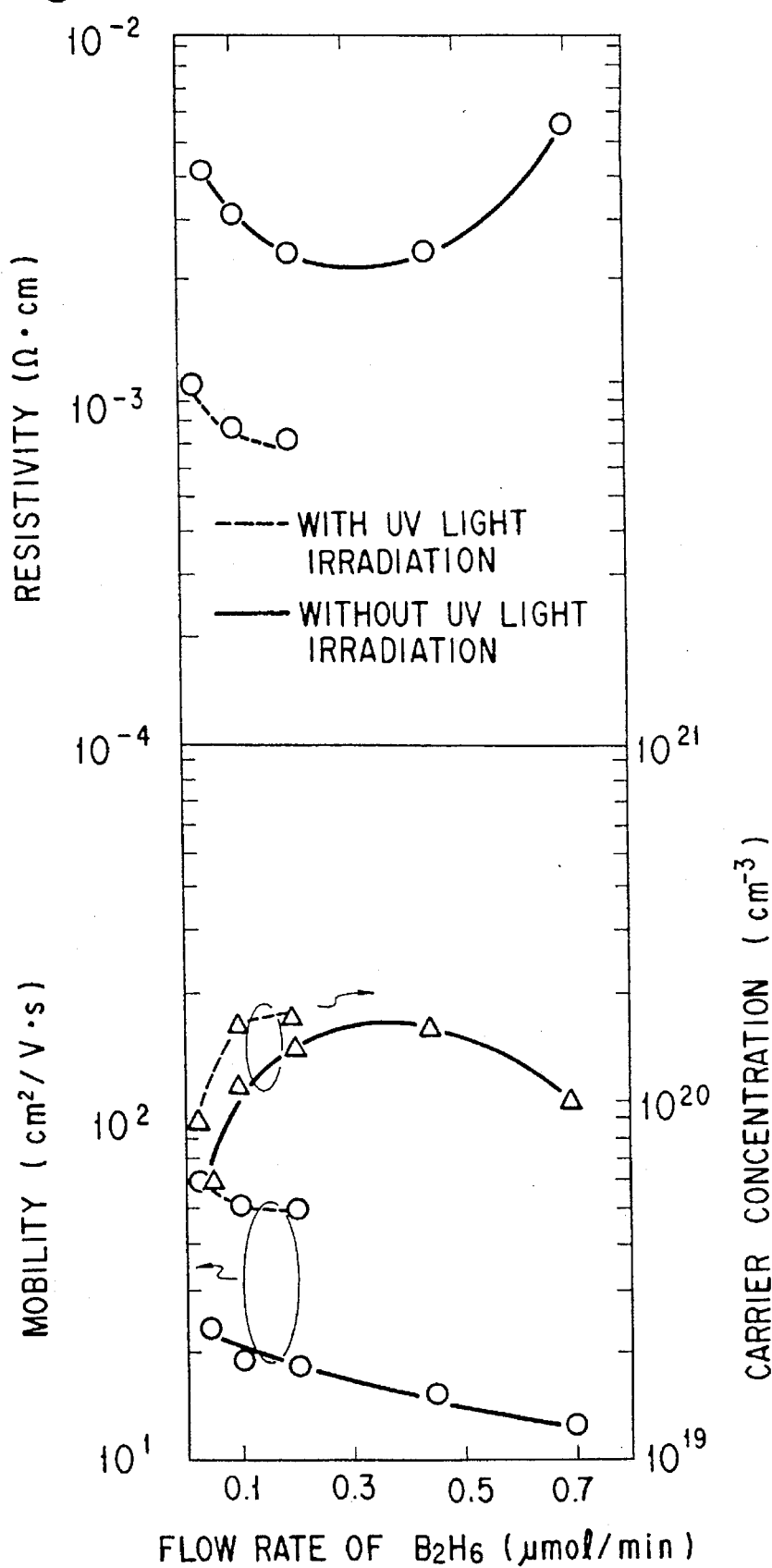
FIG. 3 is a graph showing the relations between the flow rate of $B_2H_6$ and the resistivity of film, mobility of electrons, and carrier concentration obtained in the presence and absence of the irradiation with ultraviolet light.

The relations between the flow rate of $B_2H_6$ and the resistivity of film, mobility of electrons, and carrier concentration obtained in the presence and absence of the irradiation of ultraviolet light is shown in FIG. 3. It is clearly noted from FIG. 3 that the use of the ultraviolet light lowered the resistivity by nearly one place of decimal, heightened the mobility of electrons to about two to three times the magnitude obtained in the absence of the ultraviolet irradiation, and brought about a slight increase in the carrier concentration. It is, therefore, concluded that the irradiation with the ultraviolet light is highly effective in heightening the mobility of electrons and lowering and resistivity of the film.

As described above, the method of this invention enables the transparent conductive ZnO film to be produced at a fairly low temperature by the MOCVD process and the light-MOCVD process alike. It is further capable of producing the transparent conductive ZnO film which is possessed of a textured surface form. The surface form of the produced ZnO film can be controlled by adjusting the conditions of film production, particularly the substrate temperature. When the thin film of ZnO possessed of the textured surface form which is produced by the method of this invention as described above is used in a solar cell, for example, the advantage is enjoyed that this film can be expected to produce an effect of scattering the impinging light and increase the length of light path possibly to the extent of improving the device performance.

The irradiation of the substrate with UV light during the growth of the film produces an effect of heightening the mobility of electrons, lowering the resistivity of the ZnO film, and improving though slightly the rate of film formation. It ensures the produced transparent conductive ZnO film to acquire good characteristic properties.

The example cited above represents an experiment using diborane as a dopant. When this procedure was repeated, excepting an organic metal compound of Al was used instead, the results were substantially identical with those described above.

From the foregoing detailed description, it will be evident that there are a number of changes, adaptations, and modifications of the present invention which come within the province of those skilled in the art. However, it is intended that all such variations not departing from the spirit of the invention be considered as within the scope thereof as limited solely by the claims appended hereto.

What we claim is:

1. A method for the production of a transparent conductive ZnO film having a textured surface, the method comprising the preparatory steps of reducing a pressure in a vacuum chamber, heating a substrate disposed inside said vacuum chamber to a temperature in the range of from about 120° C. to about 270° C., feeding purified water as entrained by an inert carrier gas into said vacuum chamber, and adjusting the gas pressure inside said chamber to a level in the range of from 1 to 30 Torrs and the film-forming steps of supplying an organozinc compound as entrained by a carrier gas in conjunction with at least one compound selected from the group consisting of diborane, trimethyl boron, triethyl boron, triethyl aluminum, triisobutyl aluminum and dimethyl aluminum hydride into said vacuum chamber, irradiating the substrate with ultraviolet light having a wavelength of not more than 254 nm so as to be consumed at a rate of at least 1 $mW/cm^2$, and continuing the ensuing formation of said ZnO film having a textured surface under the adjusted gas pressure mentioned above.

2. A method according to claim 1, wherein said organozinc compound is dimethyl zinc or diethyl zinc.

3. A method for the production of a transparent conductive ZnO film having a textured surface on a substrate by a chemical vapor deposition process, the method comprising reducing a pressure in a vacuum chamber, entraining purified water and an organozinc compound into separate flows of a carrier gas and feeding the flows into a vacuum chamber having a reduced inner gas pressure, adjusting the inner gas pressure in said vacuum chamber to a level in the range of from 1 to 30 Torrs, supplying at least one compound selected from the group consisting of diborane, trimethyl boron, triethyl boron, triethyl aluminum, triisobutyl aluminum and dimethyl aluminum hydride into said vacuum chamber, and heating a substrate disposed inside said vacuum chamber to a temperature in the range of from about 120° C. to about 270° C. while irradiating the substrate with ultraviolet light having a wavelength of not more than 254 nm so as to be consumed at a rate of at least 1 mW/cm$^2$ to deposit said ZnO film having a textured surface on the substrate under said adjusted gas pressure.

4. A method according to claim 3, wherein said organozinc compound is dimethyl zinc or diethyl zinc.

* * * * *